United States Patent
Shin et al.

(10) Patent No.: US 7,560,796 B2
(45) Date of Patent: Jul. 14, 2009

(54) CAPACITOR AND CAPACITOR ARRAY

(75) Inventors: Eun-Seok Shin, Seoul (KR); Hee-Cheol Choi, Suwon-si (KR); Seung-Hoon Lee, Seoul (KR); Kyung-Hoon Lee, Seoul (KR); Young-Jae Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 11/634,752

(22) Filed: Dec. 6, 2006

(65) Prior Publication Data
US 2007/0138587 A1 Jun. 21, 2007

(30) Foreign Application Priority Data
Dec. 17, 2005 (KR) ...................... 10-2005-0124894

(51) Int. Cl.
*H01L 29/00* (2006.01)
(52) U.S. Cl. .................. 257/532; 257/528; 257/535; 438/393; 438/396
(58) Field of Classification Search .............. 257/528, 257/532, 535; 438/393, 396
See application file for complete search history.

(56) References Cited

U.S. PATENT DOCUMENTS

| | | | |
|---|---|---|---|
| 4,894,700 A * | 1/1990 | Nobue et al. ............... | 257/435 |
| 6,304,156 B1 * | 10/2001 | Ishizaki et al. ............... | 333/134 |
| 6,480,137 B2 | 11/2002 | Kulkarni et al. | |
| 6,509,597 B2 * | 1/2003 | Waki et al. .................. | 257/296 |
| 6,646,860 B2 | 11/2003 | Takaramoto et al. | |
| 2006/0098349 A1 * | 5/2006 | Kasahara et al. ............ | 360/317 |
| 2006/0237819 A1 * | 10/2006 | Kikuta et al. ............... | 257/532 |

FOREIGN PATENT DOCUMENTS

| | | |
|---|---|---|
| JP | 2003-017575 | 1/2003 |
| JP | 2005-136055 | 5/2005 |
| JP | 2005-151219 | 6/2005 |
| KR | 1999001795 | 1/1999 |
| KR | 20030035765 A | 5/2003 |

* cited by examiner

*Primary Examiner*—Phuc T Dang
(74) *Attorney, Agent, or Firm*—Mills & Onello, LLP

(57) ABSTRACT

In a capacitor and a capacitor array configured for reducing an effect of parasitic capacitance, the capacitor array can have a matrix configuration that includes a plurality of unit capacitors. The unit capacitors include a lower electrode and an upper electrode that constitute a plate capacitor, as well as shielding structures which enclose the capacitor. The unit capacitors are connected by an upper electrode connecting line with a first direction to constitute a plurality of capacitor columns, wherein the unit capacitors are also arranged in rows, in a second direction perpendicular to the first direction, and wherein lower electrode lead lines are disposed between the capacitor columns, the lower electrode lead lines being connected to the respective lower electrodes of each of the unit capacitors.

26 Claims, 12 Drawing Sheets

V————————————V'

VI————————————VI'

CAPACITOR AND CAPACITOR ARRAY

CROSS-REFERENCE TO RELATED APPLICATION

This application claims priority under 35 USC § 119 to Korean Patent Application No. 10-2005-0124894 filed on Dec. 17, 2005, in the Korean Intellectual Property Office, the contents of which are herein incorporated by reference in its entirety.

BACKGROUND OF THE INVENTION

1. Field of the Invention

The present invention relates to a capacitor and a capacitor array, and more particularly to a capacitor and a capacitor array capable of reducing an affection of parasitic capacitance.

2. Description of the Related Art

A metal oxide semiconductor (MOS) process provides a good quality oxide layer. Here, precision capacitors can be manufactured by using the good quality oxide layers. The precision capacitors constitute a capacitor array in a configuration of a binary-weighted ladder, and the capacitor array can be used in an analog-to-digital converter (ADC), a digital-to-analog converter (DAC), a filter, and so on.

A ratio matching is of great importance in the capacitors constituting the capacitor array. However, a ratio error between the capacitors results from the limitations of the manufacturing process. The ratio errors result from an edge definition error in a masking process, a thickness gradient of the oxide layer, a parasitic capacitance caused by metal lines formed on the oxide layers, and a parasitic capacitance caused by metal lines connecting the capacitors and each element.

FIGS. 1A through 1D are diagrams illustrating conventional capacitor arrays.

Referring to FIG. 1A, capacitors 110, 111 and 112 constitute a capacitor array of binary-weighted ladder type. The capacitors 110, 111 and 112, respectively, have capacitances 4C1, 2C1 and C1, and have different areas.

The capacitor 110 has an area four times larger than the area of the capacitor 112. The capacitor 111 has an area two times larger than the area of the capacitor 112. However, an area ratio of the capacitors 110, 111 and 112 is not exactly 4:2:1 because of the edge definition errors. Therefore, the approach for making a capacitor array of binary-weighted ladder shown in FIG. 1A cannot be used in precise ADCs or DACs, which adjust the capacitance by the area ratios of the capacitors.

FIG. 1B illustrates a capacitor array of a binary-weighted ladder type that eliminates the edge definition error. The capacitor array includes a plurality of unit capacitors 120 through 127 having the same areas and structures. The capacitance of the unit capacitor corresponds to C1. In this case, a required capacitance is obtained by connecting the plurality of unit capacitors 120 through 127 to each other. For example, when the capacitors 120, 121, 124 and 125 are connected, the capacitance of the connected capacitors 120, 121, 124 and 125 corresponds to 4C1. When the capacitors 122 and 126 are connected, the capacitance of the connected capacitors 122 and 126 corresponds to 2C1. The capacitance of the capacitor 127 corresponds to C1. These capacitors 120 through 127 constitute a capacitor array that provides a 4:2:1 capacitance ratio. The capacitor array in FIG. 1B eliminates the edge definition error by using the unit capacitor, but has a precision limitation caused by the thickness of the oxide layers. That is, the capacitor 120 and the capacitor 127 can have different thicknesses of the oxide layers because of the thickness gradient of the oxide layers. Thus, the capacitors 120 and 127 have different capacitances.

FIG. 1C illustrates a conventional capacitor array that reduces errors caused by the thickness gradient of the oxide layers. The capacitor array is also referred to as a capacitor array of a common centroid type. When capacitors 130 through 138 are connected to obtain a required capacitance, the capacitors 130 through 138 are connected symmetrically to the center of the capacitor array. For example, when the capacitors 130, 132, 136 and 138 are connected, the capacitance of the connected capacitors 130, 132, 136 and 138 corresponds to 4C1. When the capacitors 131 and 137 are connected, the capacitance of the connected capacitors 131 and 137 corresponds to 2C1. The capacitance of capacitor 134 corresponds to C1. These capacitors 130 through 137 constitute a capacitor array that provides a 4:2:1 capacitance ratio.

Recently, more precise capacitors have been manufactured owing to a development of the MOS process technology. In addition, as an area of the unit capacitor is decreased, the capacitance of the unit capacitor is decreased. Therefore, a problem of the parasitic capacitance occurs more frequently. For example, the thickness gradient of the oxide layers is scarcely problematic in the capacitor array of the common centroid type in FIG. 1C. However, more parasitic capacitances occur, for example, between the lines connecting the unit capacitors with a small capacitance and the unit capacitors, and between the unit capacitors, in comparison with the capacitance of the unit capacitor. Thus, the capacitor array of the common centroid type cannot be readily adapted for large-scaled integrated ADCs or DACs.

FIG. 1D illustrates a capacitor array disclosed in Korean Patent Laid-Open Publication No. 1999-001795. The capacitors 140 through 146 constituting the capacitor array are arranged in a row at identical intervals in the same direction. The capacitor array in FIG. 1D is less affected by the parasitic capacitance caused by the metal lines, owing to simply arranging the capacitors in a row. In addition, by connecting 4 or 2 capacitors symmetrically to the center, there is a reduced influence of the gradient of the thickness of the oxide layers. However, a straight-typed capacitor array as shown in FIG. 1D is not readily adapted to being manufactured with a large number capacitors.

SUMMARY OF THE INVENTION

In accordance with one aspect of the present invention, provided is a capacitor array capable of reducing influences caused by parasitic elements of the environments.

In accordance with another aspect of the present invention, provided is a unit capacitor for a capacitor array capable of reducing influences caused by parasitic elements of the environments.

In accordance with one aspect of the present invention, provided is a capacitor comprising a lower electrode formed over a semiconductor substrate; an upper electrode constituting a plate capacitor together with the lower electrode; a first subordinate shielding structure formed on the same layer as the lower electrode and configured to substantially enclose the lower electrode; and a second subordinate shielding structure formed on the same layer as the upper electrode and configured to substantially enclose the upper electrode.

The upper electrode can include a first upper electrode and a second upper electrode formed on the first upper electrode, and the second subordinate shielding structure can be formed on the same layer as the second upper electrode.

The capacitor can further include a third subordinate shielding structure formed over the upper electrode.

The third subordinate shielding structure can have a configuration of a rectangular strip.

The capacitor can further include a fourth subordinate shielding structure formed under the lower electrode.

The fourth subordinate shielding structure can have a configuration of a rectangular strip.

The first subordinate shielding structure can have a configuration of a C-shaped strip.

The second subordinate shielding structure can have a configuration of two square brackets partially enclosing the second upper electrode.

The first and the second subordinate shielding structures can be electrically connected through VIA contacts.

In accordance with another aspect of the present invention, a capacitor can include a lower electrode formed over a semiconductor substrate in a rectangular configuration; a first upper electrode configured to constitute a plate capacitor together with the lower electrode in a rectangular configuration, wherein area of the first upper electrode is smaller than the area of the lower electrode; a second upper electrode formed on the first upper electrode in a rectangular configuration, wherein area of the second upper electrode is smaller than the area of the first upper electrode; a first subordinate shielding structure formed on the same layer as the lower electrode and configured to substantially enclose the lower electrode, the first subordinate shielding structure being spaced apart from the lower electrode and has a configuration of a C-shaped strip; and a second subordinate shielding structure formed on the same layer as the second upper electrode and first subordinate shielding structure the second upper electrode, the second subordinate shielding structure being spaced apart from the second upper electrode and having a configuration of two square brackets partially enclosing the second upper electrode. The first and the second subordinate shielding structures are electrically connected.

The capacitor can further include a third subordinate shielding structure formed over the second upper electrode and the third subordinate shielding structure can be electrically connected to the first and the second subordinate shielding structures.

The third subordinate shielding structure can have a configuration of a rectangular strip.

The capacitor can further include a fourth subordinate shielding structure formed under the lower electrode and the fourth subordinate shielding structure can be electrically connected to the first through the third subordinate shielding structures.

The fourth subordinate shielding structure can have a configuration of a rectangular strip.

The first and the second subordinate shielding structures can be electrically connected through VIA contacts.

According to still another aspect of the present invention, provided is a capacitor array having a matrix configuration including a plurality of unit capacitors, each of the unit capacitors can include a lower electrode; an upper electrode which constitutes a plate capacitor together with the lower electrode; and a shielding structure configured to substantially enclose the lower and the upper electrodes. The unit capacitors are connected by an upper electrode connecting line formed in a first direction to constitute a plurality of capacitor columns, and the unit capacitors are also arranged in rows in a second direction perpendicular to the first direction, and wherein lower electrode lead lines are disposed between the capacitor columns and the lower electrode lead lines are connected to the respective lower electrodes of each of the unit capacitors.

The shielding structure can include a first subordinate shielding structure formed on the same layer as the lower electrode and configured to substantially enclose the lower electrode; and a second subordinate shielding structure formed on the same layer as the upper electrode and configured to substantially enclose the upper electrode.

The upper electrode can include a first upper electrode and a second upper electrode formed on the first upper electrode, and the second subordinate shielding structure and the upper electrode connecting line are formed on the same layer as the second upper electrode.

The capacitor array can further include a third subordinate shielding structure formed over the upper electrode and having a configuration of a rectangular strip.

The capacitor array can further include a fourth subordinate shielding structure formed under the lower electrode has and having a configuration of a rectangular strip.

The first subordinate shielding structure can have a configuration of a C-shaped strip and the second subordinate shielding structure can have a configuration of two square brackets partially enclosing the second upper electrode.

The first and the second subordinate shielding structures can be electrically connected through VIA contacts.

The lead lines can include dummy patterns.

A dummy pattern can be formed between the capacitor columns.

The lead lines can be arranged in two parallel lines between the capacitor columns.

The capacitor columns can each include the same number of unit capacitors.

The capacitor columns can each include no less than 2 and no more than 4 unit capacitors.

As a result, a unit capacitor and a capacitor array according to aspects of the present invention can have reduced parasitic capacitance effect.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention.

DESCRIPTION OF THE EMBODIMENTS

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected," or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Figure 1A:
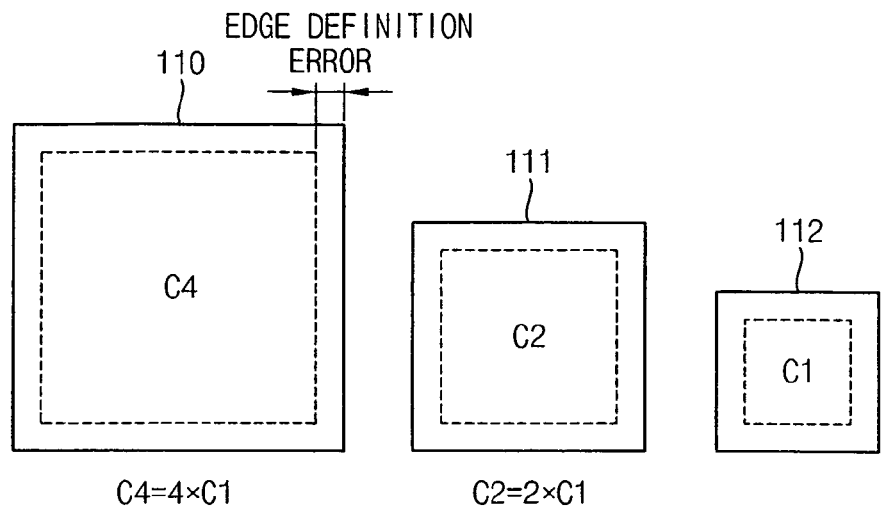
FIGS. 1A through 1D are diagrams illustrating conventional capacitor arrays.
Figure 1B:
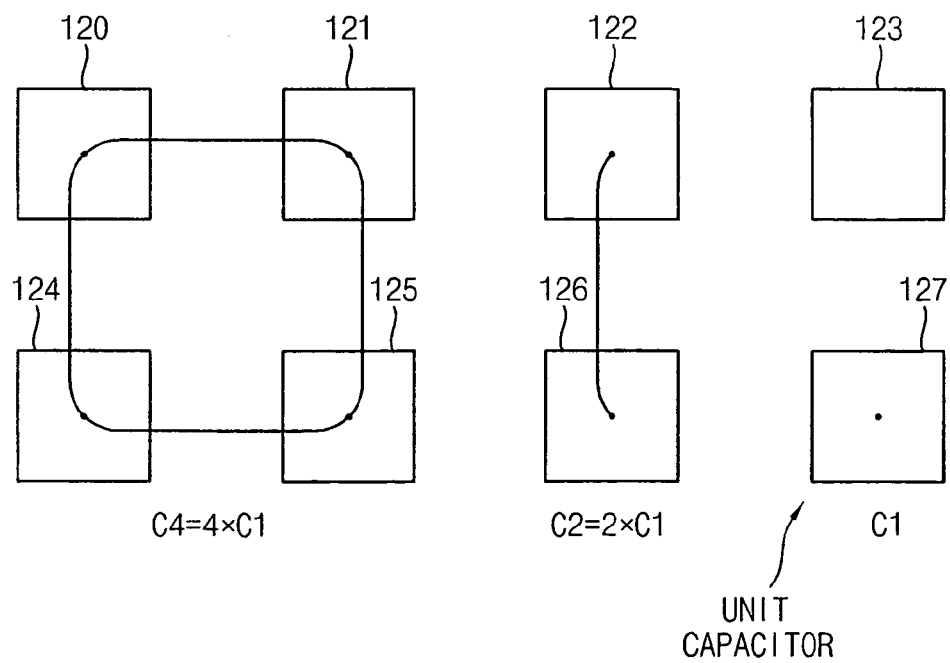
Figure 1C:
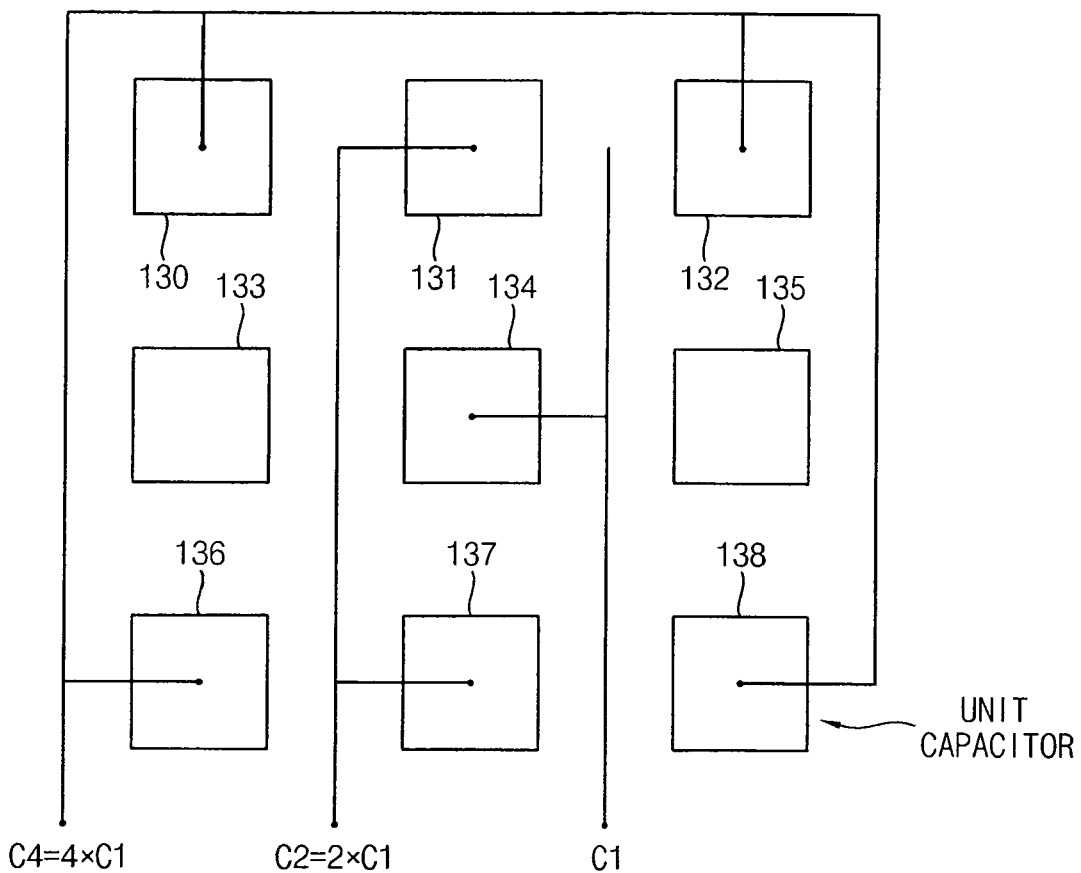
Figure 1D:
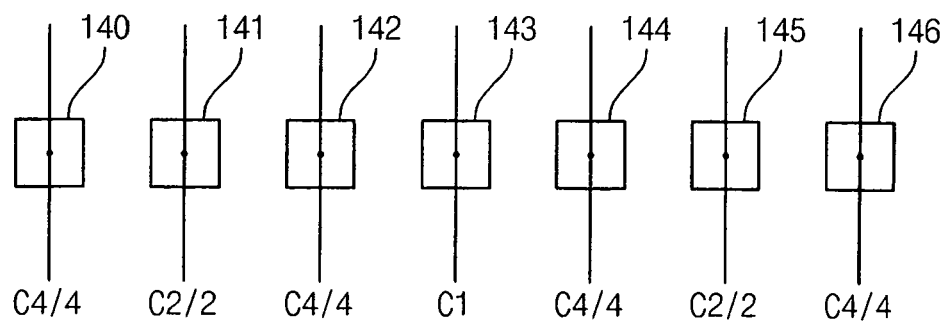
Figure 2:
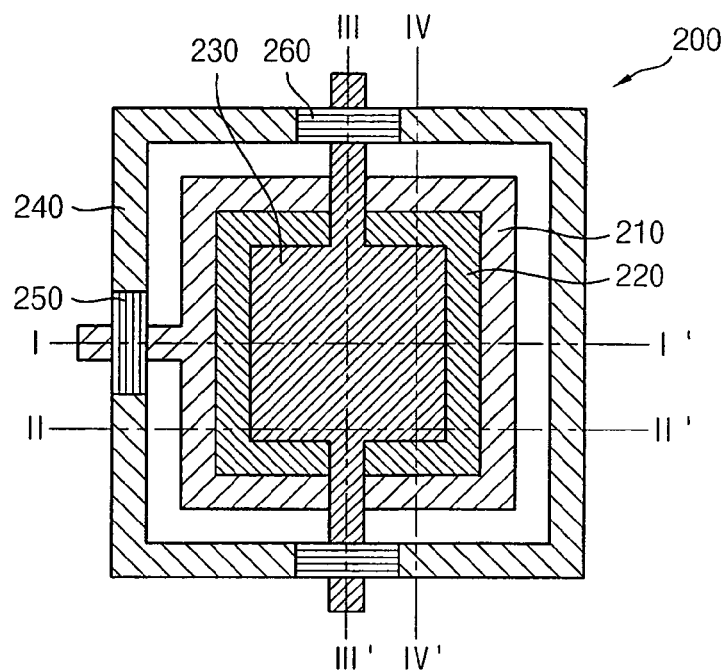
FIG. 2 is a schematic diagram illustrating an example embodiment of a capacitor according to aspects of the present invention.

FIG. 2 is a schematic diagram illustrating an example embodiment of a capacitor according to an aspect of the present invention.

A capacitor 200 has a metal-insulator-metal (MIM) structure and is formed by a semiconductor process. The capacitor 200 includes a lower electrode 210, upper electrodes 220 and 230, and a shielding structure 240 that encloses the lower electrode 210 and the upper electrodes 220 and 230. The lower electrode 210 is formed on a semiconductor substrate (not shown) and the upper electrodes 220 and 230 constitute a plate capacitor.

The upper electrodes 220 and 230 include a first upper electrode 220 and a second upper electrode 230 formed on the first upper electrode 220. The first upper electrode 220 can be made of a conductive material, such as tungsten W.

The shielding structure 240 reduces influences on the capacitor 200 caused by the environment, e.g., other capacitors or metal lines connecting the electrodes of the capacitors. That is, the shielding structure 240 isolates the capacitor 200 from conductive materials in the environment.

The shielding structure 240 includes, or has formed therein, a space 250 for lines that connect lead lines (not shown) to the lower electrode 210 and a space 260 for lines that connect the second upper electrode 230 to a second upper electrode of another capacitor in the capacitor array. The lead lines (not shown) connect the lower electrode 210 to external elements.

A vertical cross-sectional structure of the capacitor 200 will be described referring to FIGS. 3A through 3D, and a horizontal cross-sectional structure of the capacitor will be described referring to FIGS. 4A through 4E.

Figure 3A:
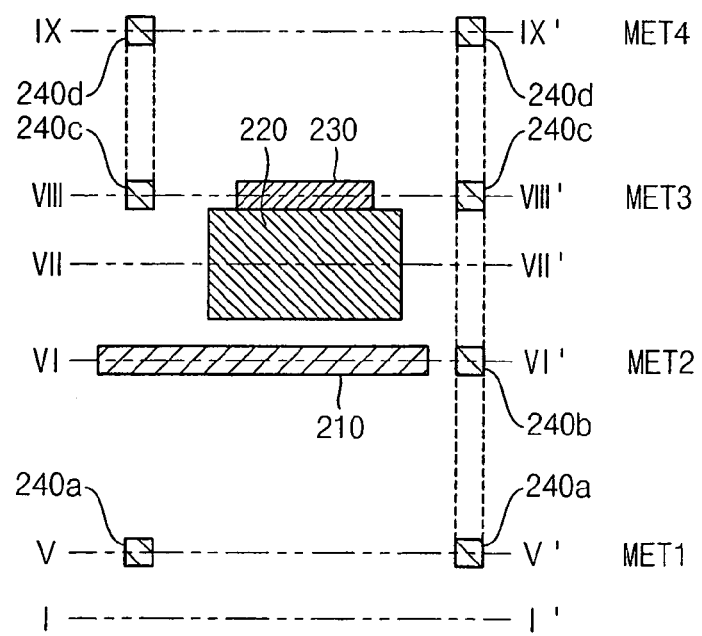
FIGS. 3A through 3D are cross-sectional views illustrating vertical cross-sectional structures of the capacitor in FIG. 2.

FIG. 3A is a vertical cross-sectional view taken along line I-I' of FIG. 2.

Figure 3B:
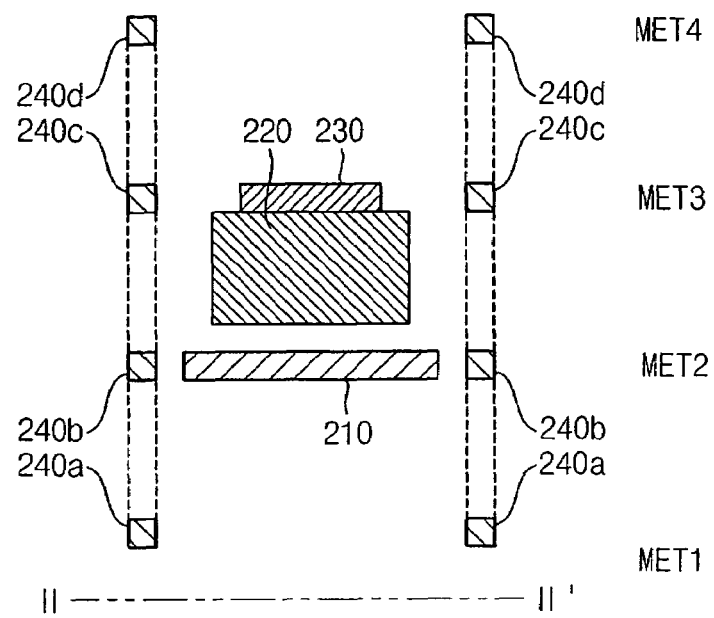

FIG. 3B is a vertical cross-sectional view taken along line II-II' of FIG. 2.

Figure 3C:
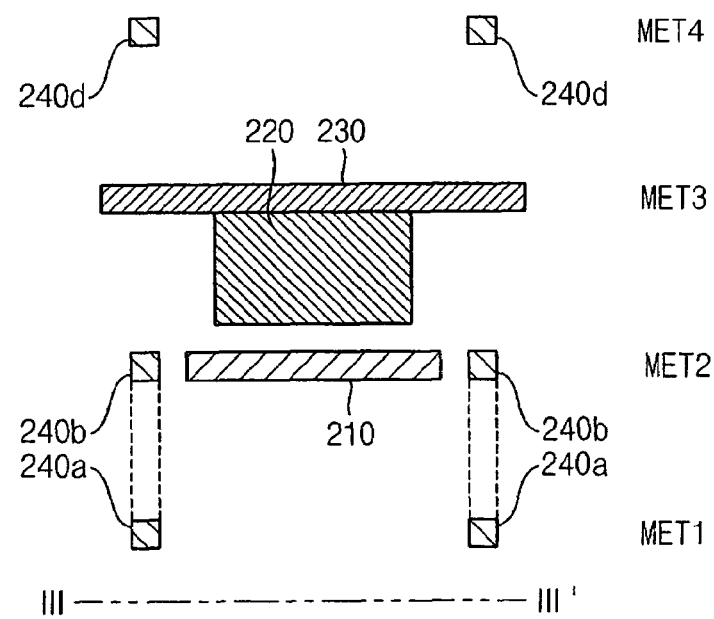

FIG. 3C is a vertical cross-sectional view taken along line III-III' of FIG. 2.

Figure 3D:
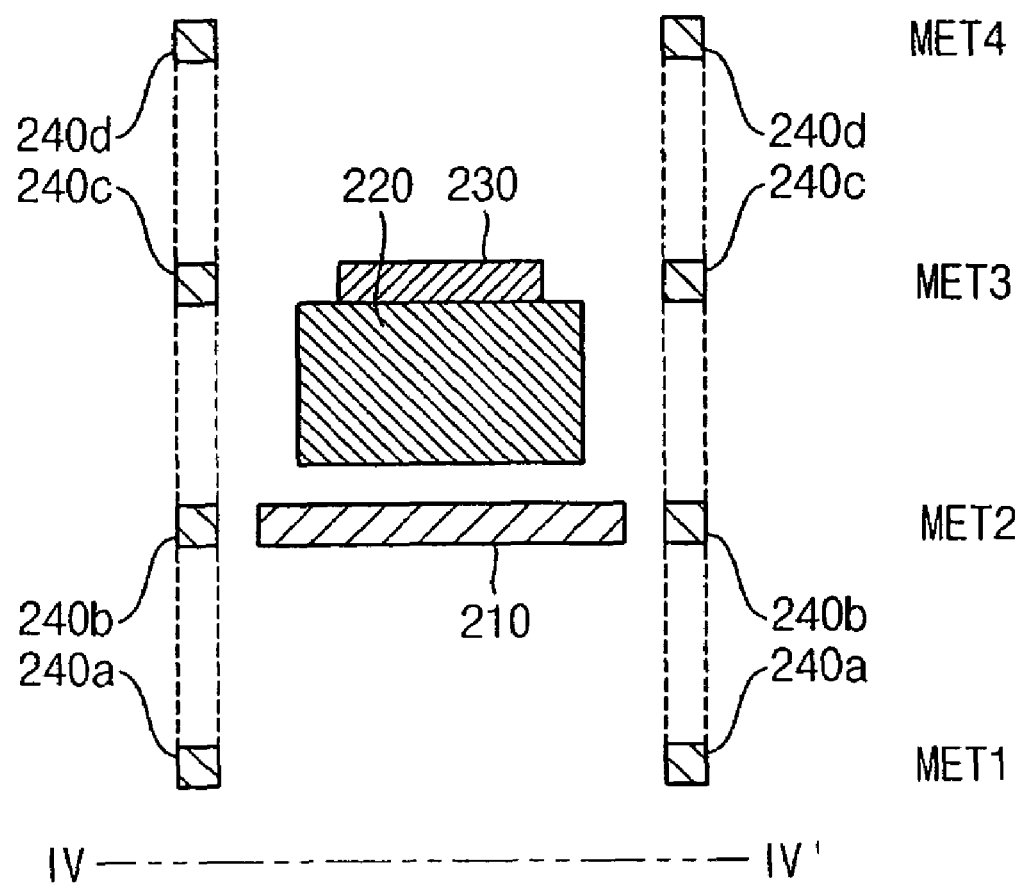

FIG. 3D is a vertical cross-sectional view taken along line IV-IV' of FIG. 2.

The lower electrode 210 is formed in a metal 2 layer MET2 and has a square configuration seen from above. The first upper electrode 220 is formed over the lower electrode 210 and also has a square configuration. An insulating layer, such as $SiO_2$ layer, is disposed between the lower and the first upper electrodes 210 and 220. The second upper electrode 230 is formed in a metal 3 layer MET3 and has a square configuration seen from above. An area of the first upper electrode 220 is smaller than an area of the lower electrode 210. An area of the second upper electrode 230 is smaller than the area of the first upper electrode 220.

The shielding structure 240 includes four subordinate shielding structures 240a, 240b, 240c and 240d. The subordinate shielding structure 240b is formed in the metal 2 layer MET2 and substantially encloses the lower electrode 210 at a distance from the lower electrode 210. The subordinate shielding structure 240c is formed in a metal 3 layer MET3 and substantially encloses the second upper electrode 230 at a distance from the second upper electrode 230. The subordinate shielding structure 240a is formed in a metal 1 layer MET1. The subordinate shielding structure 240d is formed in a metal 4 layer MET4.

The subordinate shielding structure 240b shields a probable parasitic capacitance between the lower electrode 210 and adjacent lines formed in the metal 2 layer MET2, or between the lower electrode 210 and lower electrodes of adjacent capacitors, if present. However, the subordinate shielding structure 240b will likely not be capable of shielding all the probable parasitic capacitance between the lower electrode 210 and the adjacent lines formed in the metal 2 layer MET2, or between the lower electrode 210 and the lower electrodes of the adjacent capacitors. Thus, the capacitor 200 includes the subordinate shielding structure 240a formed in the metal 1 layer MET1 and configured to more effectively shield the probable parasitic capacitance.

The subordinate shielding structure 240c shields a probable parasitic capacitance between the second upper electrode 230 and adjacent lines formed in the metal 3 layer MET3, or between the second upper electrode 230 and the upper electrodes of adjacent capacitors. However, the subordinate shielding structure 240c will likely not be capable of shielding all the probable parasitic capacitance between the second upper electrode 230 and the adjacent lines formed in the metal 3 layer MET3, or between the second upper electrode 230 and the upper electrodes of the adjacent capacitors. Thus, the capacitor 200 includes the subordinate shielding structure 240d formed in the metal 4 layer MET4 and configured to shield the probable parasitic capacitance more effectively.

The subordinate shielding structures 240a through 240d are electrically coupled together through VIA contacts (known in the art). The VIA contacts are represented as dotted lines in FIGS. 3A through 3D.

FIGS. 4A through 4E are cross-sectional views illustrating the horizontal structures of the capacitor 200 in FIG. 2.

Figure 4A:
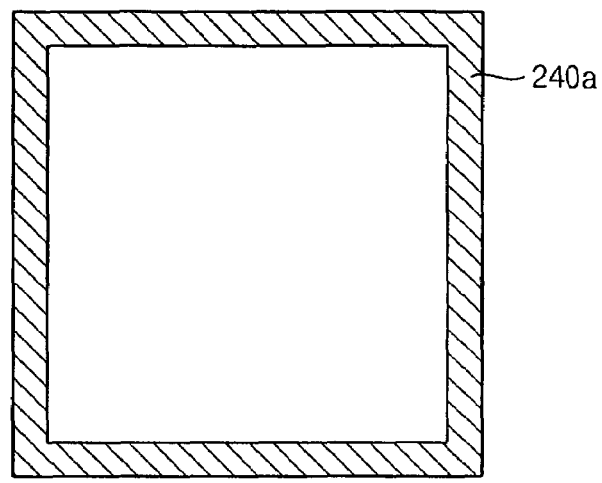
FIGS. 4A through 4E are cross-sectional views illustrating the horizontal structures of the capacitor in FIG. 2.

FIG. 4A is a horizontal cross-sectional view taken along line V-V' of FIG. 3A.

Figure 4B:
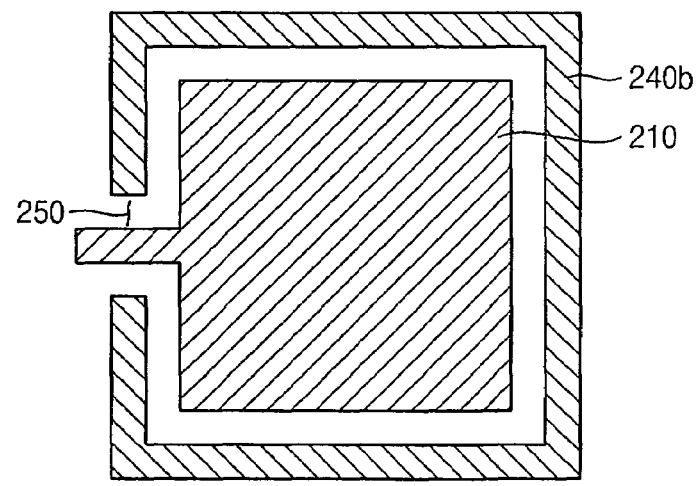

FIG. 4B is a horizontal cross-sectional view taken along line VI-VI' of FIG. 3A.

Figure 4C:
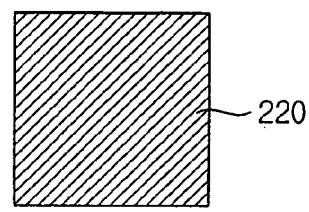

FIG. 4C is a horizontal cross-sectional view taken along line VII-VII' of FIG. 3A.

Figure 4D:
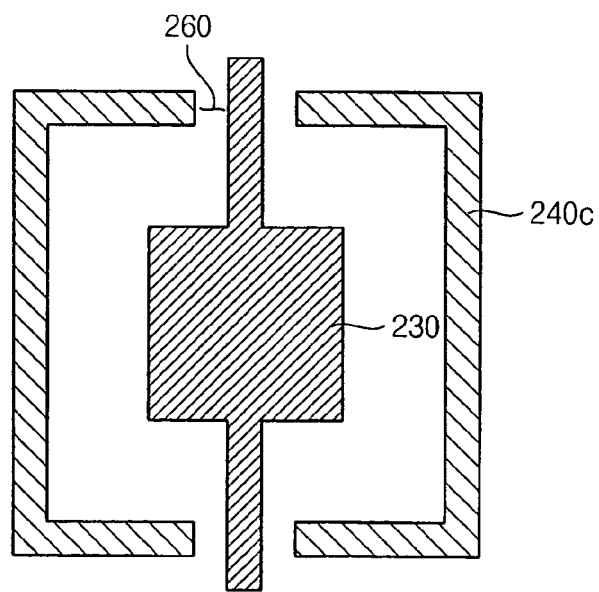

FIG. 4D is a horizontal cross-sectional view taken along line VIII-VIII' of FIG. 3A.

Figure 4E:
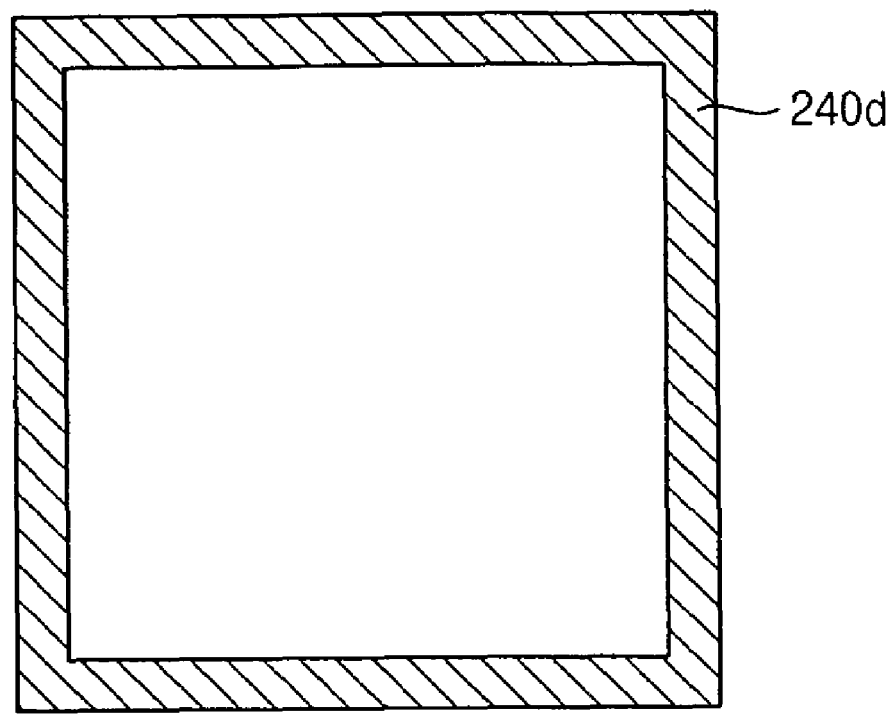

FIG. 4E is a horizontal cross-sectional view taken along line IX-IX' of FIG. 3A.

The subordinate shielding structure 240a formed in the metal 1 layer MET1 is disposed in the cross-section taken along the line V-V', as shown in FIG. 4A. The subordinate shielding structure 240a has a configuration of a rectangular strip.

The subordinate shielding structure 240b formed in the metal 2 layer MET2 and the lower electrode 210 are disposed in the cross-section taken along the line VI-VI'. The lower electrode 210 has a rectangular configuration, as shown in FIG. 4B. The subordinate shielding structure 240b has a configuration of a C strip type with, or a rectangle with one side having an open space formed therein. The open space 250 forms a passage for the lines connecting lead lines (not shown) to the lower electrode 210. That is, the lead lines connect the lower electrode 210 to external elements.

The first upper electrode 220, shown in FIG. 4C, is disposed in the cross-section taken along line VII-VII'. The first upper electrode 220 has a rectangular configuration whose area is smaller than the area of the lower electrode 210. Not shown in FIG. 4C, there are disposed VIA contacts for electrically connecting the subordinate shielding structures around the first upper electrode 220.

The subordinate shielding structure 240c formed in the metal 3 layer MET3 and the second upper electrode 230 are disposed in the cross-section taken along line VIII-VIII'. The second upper electrode 230 has a substantially rectangular configuration and an area that is smaller than the area of the first upper electrode 220. The subordinate shielding structure 240c has a configuration of two square brackets partially enclosing the second upper electrode 230. The open space 260 is a space for lines connecting the second upper electrode 230 to second upper electrodes of other capacitors.

The subordinate shielding structure 240d(shown in FIG. 4E) formed in the metal 4 layer MET4 is disposed in the cross-section taken along line IX-IX'. The subordinate shielding structure 240d has a rectangular configuration.

The foregoing is illustrative of the present invention and is not to be construed as limiting thereof. For example, the subordinate shielding structures can have a configuration of an integrated rectangular cylinder by disposing VIA contacts consecutively along the lines of the subordinate shielding structures. In addition, each electrode in FIG. 2 has a rectangular configuration, but an electrode having a round edge can be adapted for preventing the concentration of electric field on the edge.

Figure 5:
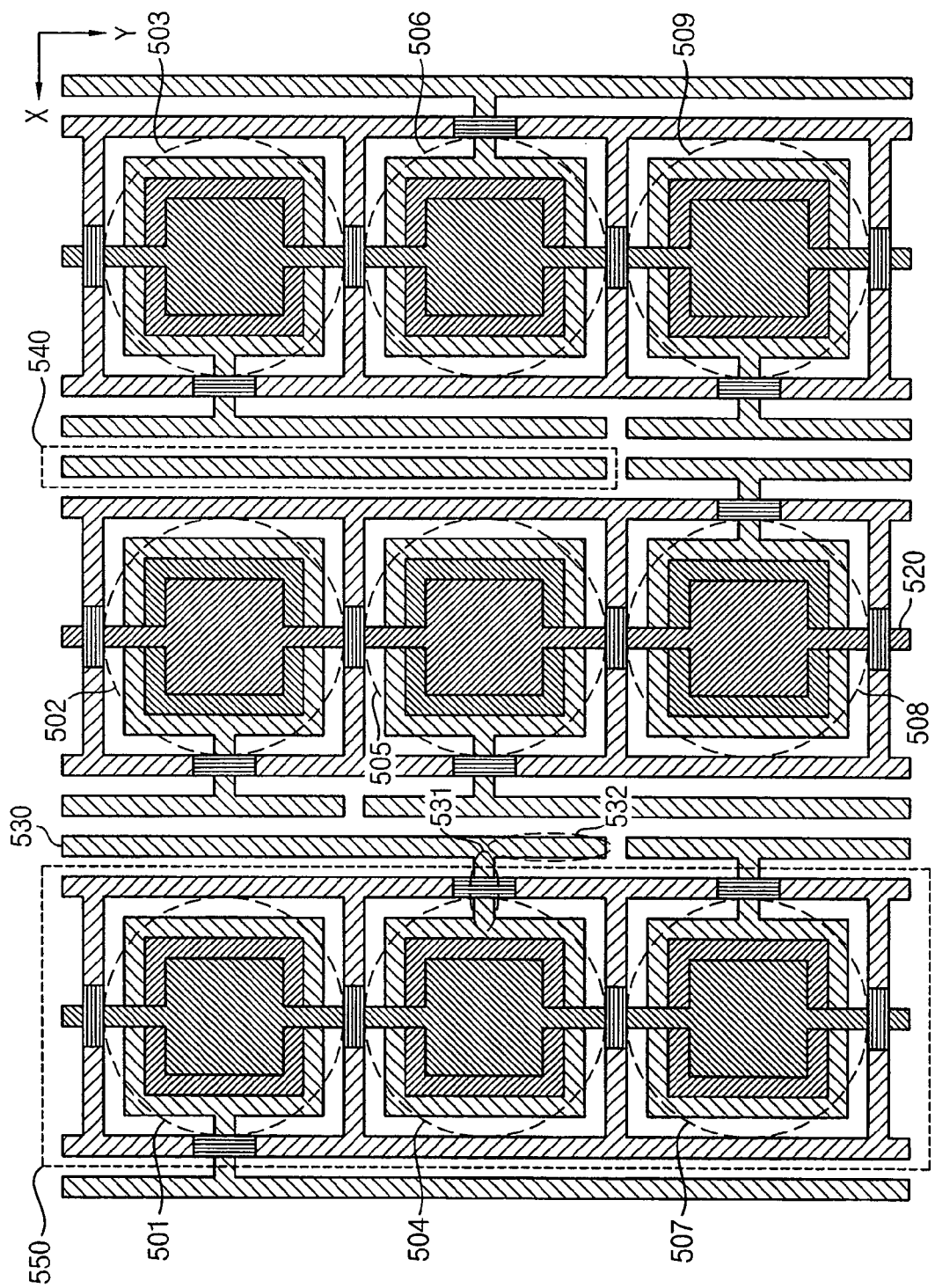
FIG. 5 is a diagram illustrating another example embodiment of a capacitor array according to aspects of the present invention.

FIG. 5 illustrates a capacitor array according to an example embodiment of the present invention. The capacitor array includes a plurality of unit capacitors 501 through 509 in a matrix structure. The unit capacitors 501, 504 and 507, the unit capacitors 502, 505 and 508 and the unit capacitors 503, 506 and 509 respectively constitute capacitor columns 550 in a Y-axis direction. The unit capacitor 501, 502, and 503, and 504, 505, and 506, and 507, 508, and 509 are respectively arranged in rows in an X-axis direction.

The upper electrodes in the each capacitor column are coupled by upper electrode connecting lines 520. Lower electrode lead lines 530 for coupling each of the unit capacitors to the external elements are disposed between the respective capacitor columns. The lower electrode lead lines 530 are electrically coupled to the lower electrodes of the unit capacitors through lines 531. In addition, the lower electrode lead lines 530 include dummy patterns 532. The dummy patterns 532 increase the symmetry of the capacitor array so that the particular unit capacitor can not be intensively influenced by parasitic capacitances. In addition, the dummy patterns 532 are capable of evenly distributing electric characteristics of the lower electrode lead lines 530.

The capacitor array can further include dummy patterns 540 which are not coupled to the external elements, shown beside the dummy patterns 532. The dummy patterns 540 can also increase the symmetry of the capacitor array, thereby distributing the effect of the parasitic capacitance to the whole capacitor array, and can be capable of evenly distributing electric characteristics of the adjacent lower electrode lead lines 530.

The lower electrode lead lines 530 are arranged in two lines or columns between the capacitor columns, as illustrated in FIG. 5. Thus, the capacitor column can include no more than 4 unit capacitors in the Y direction, in this example embodiment. That is, a capacitor array having a matrix configuration according to an example embodiment of the present invention can include no less than 2 and no more than 4 unit capacitors in the Y direction.

Figure 6:
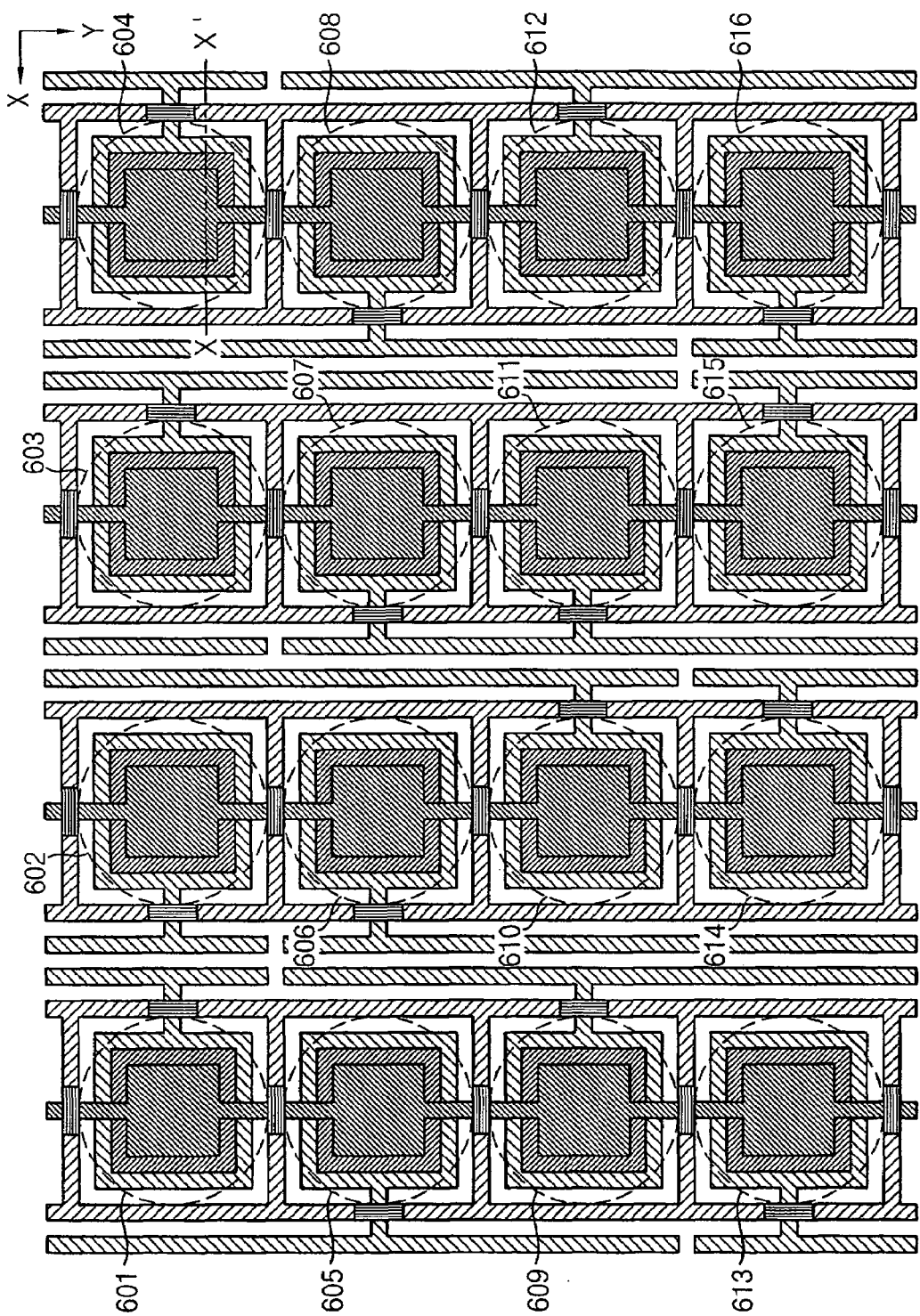
FIG. 6 is diagram illustrating another example embodiment of a capacitor array including 4 unit capacitors in the Y direction according to aspects of the present invention.

FIG. 6 is a diagram illustrating a capacitor array including 4 unit capacitors in the Y direction according to an example embodiment of the present invention. The capacitor array includes unit capacitors 601 through 616. Unit capacitors 601, 605, 609 and 613, unit capacitors 602, 606, 610 and 614, unit capacitors 603, 607, 611 and 615 and unit capacitors 604, 608, 612 and 616 respectively constitute capacitor columns. The capacitor array in FIG. 6, includes dummy patterns in the lower electrode lead lines, and does not include dummy patterns that are not coupled to the external elements, as with the dummy patterns 532 and 540 of the capacitor array in FIG. 5.

The unit capacitors in the above capacitor arrays can have the form of the unit capacitor 200 as shown in FIGS. 2 through 4, or can be another type of capacitor.

Another type of capacitor will be described referring to FIGS. 7 through 10, which are vertical cross-sectional views illustrating unit capacitors applicable to the capacitor array in FIG. 6. The cross-section is taken along line X-X' in FIG. 6.

Figure 7:
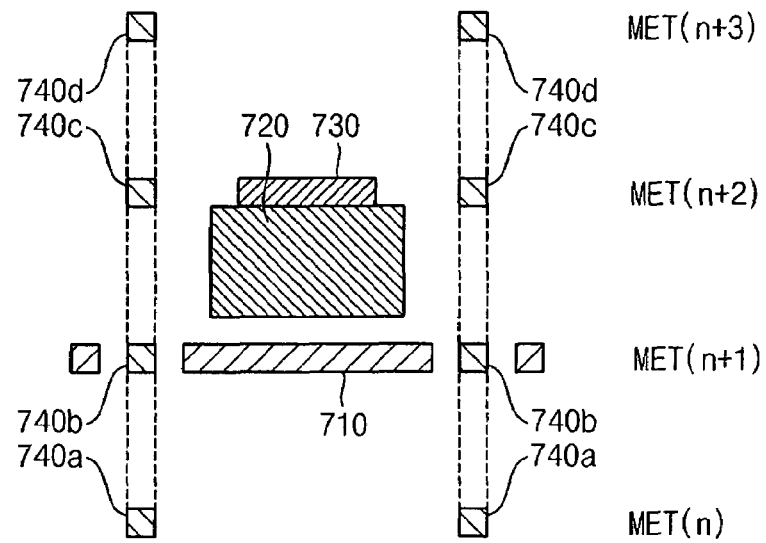
FIGS. 7 through 10 are vertical cross-sectional views illustrating example embodiments of unit capacitors applicable to the capacitor array in FIG. 6.

Referring to FIG. 7, the capacitor in FIG. 7 has the same architecture as the capacitor 200 in FIG. 2. Subordinate shielding structures 740a through 740d, VIA contacts connecting the subordinate shielding structures 740a through 740d, a lower electrode 710, a first upper electrode 720 and a second upper electrode 730, respectively, have the same configuration as the corresponding elements of the capacitor 200 in FIG. 2. The capacitor in FIG. 7 is formed in four metal layers depicted as MET(n) through MET(n+3), similar to the capacitor 200 in FIG. 2 formed in four metal layers depicted as MET1 to MET4 (see FIG. 3B).

Figure 8:
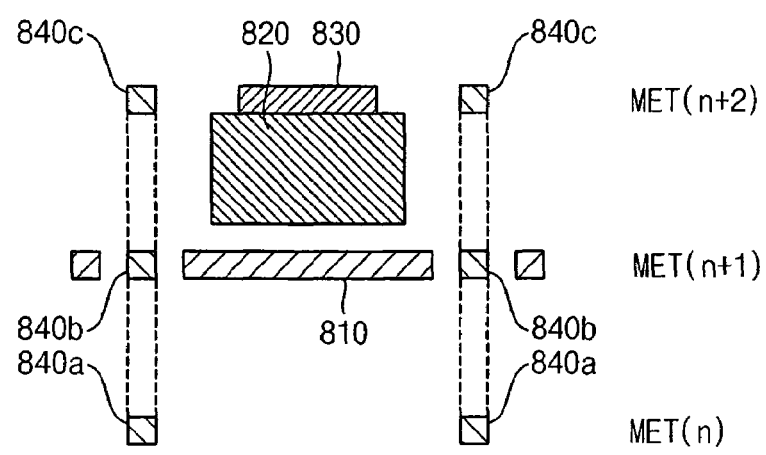

Referring to FIG. 8, subordinate shielding structures 840a through 840c, VIA contacts connecting the subordinate shielding structures 840a through 840c, a lower electrode 810, a first upper electrode 820 and a second upper electrode 830 through have the same configuration as the corresponding elements of the capacitor 200 in FIG. 2. However, the capacitor in FIG. 8 does not have another subordinate shielding structure over the subordinate shielding structure 840c, like subordinate shielding layer 240d in FIGS. 2 and 3B. The structure of the capacitor in FIG. 8 is applicable when, for example, the second upper electrode 830 is formed in the uppermost metal layer.

Figure 9:
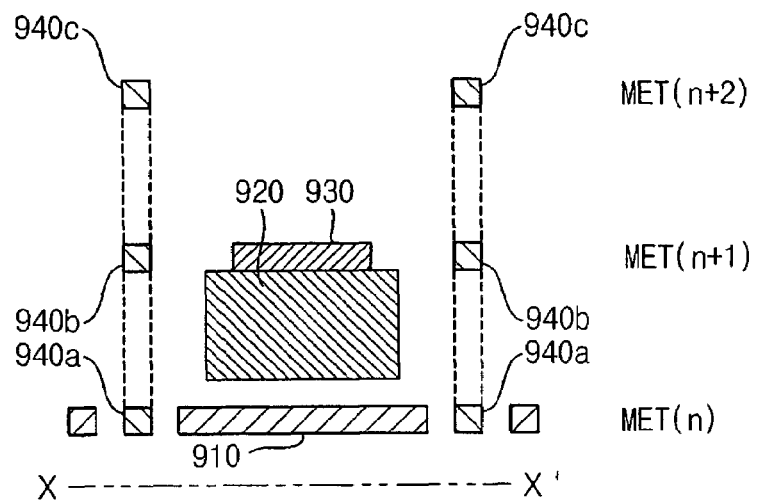

Referring to FIG. 9, subordinate shielding structures 940a through 940c, VIA contacts connecting the subordinate shielding structures 940a through 940c, a lower electrode 910, a first upper electrode 920 and a second upper electrode 930, respectively, have the same configuration as the corresponding elements of the capacitor 200 in FIG. 2. However, the capacitor in FIG. 9 does not have another subordinate shielding structure under the subordinate shielding structure 940a, in contrast to the capacitor 200 in FIG. 2. The structure of the capacitor in FIG. 9 is applicable when, for example, the lower electrode 910 is formed in the lowermost metal layer.

Figure 10:
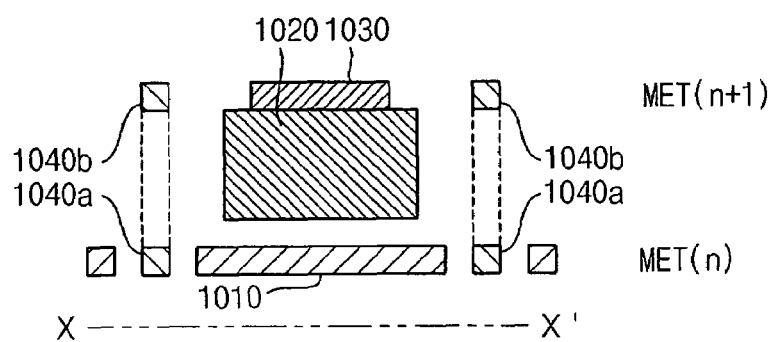

Referring to FIG. 10, subordinate shielding structures 1040a and 1040b, VIA contacts connecting the subordinate shielding structures 1040a and 1040b, a lower electrode 1010, a first upper electrode 1020 and a second upper electrode 1030, respectively, have the same configuration as the corresponding elements of the capacitor 200 in FIG. 2. However, the capacitor in FIG. 10 does not have subordinate shielding structures under the subordinate shielding structure 1040a and over the subordinate shielding structure 1040b, in contrast to the capacitor 200 in FIG. 2. The structure of the capacitor in FIG. 10 is applicable when, for example, the capacitor in FIG. 10 is formed by using two metal layers.

As described above, since a unit capacitor according to an example embodiment of the present invention has a shielding structure, the unit capacitor can be adapted to a capacitor array having reduced effect of the parasitic capacitance. Therefore, a precise analog device can be manufactured when the capacitor array having the unit capacitor according to an example embodiment of the present invention is used.

Having thus described example embodiments of the present invention, it is to be understood that the invention defined by the appended claims is not to be limited by particular details set forth in the above description as many apparent variations thereof are possible without departing from the spirit or scope thereof as hereinafter claimed. It is intended by the following claims to claim that which is literally described and all equivalents thereto, including all modifications and variations that fall within the scope of each claim.

What is claimed is:

1. A capacitor comprising:
   a lower electrode formed over a semiconductor substrate;
   an upper electrode constituting a plate capacitor together with the lower electrode;
   a first subordinate shielding structure formed on the same layer as the lower electrode and configured to substantially enclose the lower electrode;
   a second subordinate shielding structure formed on the same layer as the upper electrode and configured to substantially enclose the upper electrode, and
   a third subordinate shielding structure formed over the upper electrode.

2. The capacitor of claim 1, wherein the upper electrode comprises a first upper electrode and a second upper electrode formed on the first upper electrode, and
   wherein the second subordinate shielding structure is formed on the same layer as the second upper electrode.

3. The capacitor of claim 1, wherein the third subordinate shielding structure has a configuration of a rectangular strip.

4. The capacitor of claim 1, further comprising,
   a fourth subordinate shielding structure formed under the lower electrode.

5. The capacitor of claim 4, wherein the fourth subordinate shielding structure has a configuration of a rectangular strip.

6. The capacitor of claim 1, wherein the first subordinate shielding structure has a configuration of a C-shaped strip.

7. The capacitor of claim 1, wherein the second subordinate shielding structure has a configuration of two square brackets partially enclosing the second upper electrode.

8. The capacitor of claim 1, wherein the first and the second subordinate shielding structures are electrically connected to each other through VIA contacts.

9. A capacitor comprising:
   a lower electrode formed over a semiconductor substrate in a rectangular configuration;
   a first upper electrode configured to constitute a plate capacitor together with the lower electrode in a rectangular configuration, an area of the first upper electrode being smaller than that of the lower electrode;
   a second upper electrode formed on the first upper electrode in a rectangular configuration, an area of the second upper electrode being smaller than that of the first upper electrode;
   a first subordinate shielding structure formed on the same layer as the lower electrode and configured to substantially enclose the lower electrode, the first subordinate shielding structure being spaced apart from the lower electrode and having a configuration of a C-shaped strip; and
   a second subordinate shielding structure formed on the same layer as the second upper electrode and configured to substantially enclose the second upper electrode, the second subordinate shielding structure being spaced apart from the second upper electrode and having a configuration of two square brackets partially enclosing the second upper electrode, the first and second subordinate shielding structures being electrically connected to each other.

10. The capacitor of claim 9, further comprising,
    a third subordinate shielding structure formed over the second upper electrode, the third subordinate shielding structure being electrically connected to the first and the second subordinate shielding structures.

11. The capacitor of claim 10, wherein the third subordinate shielding structure has a configuration of a rectangular strip.

12. The capacitor of claim 9, further comprising,
    a fourth subordinate shielding structure formed under the lower electrode, the fourth subordinate shielding structure being electrically connected to the first through the third subordinate shielding structures.

13. The capacitor of claim 12, wherein the fourth subordinate shielding structure has a configuration of a rectangular strip.

14. The capacitor of claim 9, wherein the first and the second subordinate shielding structures are electrically connected to each other through VIA contacts.

15. A capacitor array having a matrix configuration including a plurality of unit capacitors, each of the unit capacitors comprising:
    a lower electrode;
    an upper electrode constituting a plate capacitor together with the lower electrode; and
    a shielding structure configured to enclose the lower and the upper electrodes,
    wherein the unit capacitors are connected by an upper electrode connecting line formed in a first direction to constitute a plurality of capacitor columns,
    wherein the unit capacitors are also arranged in rows in a second direction perpendicular to the first direction, and,
    wherein lower electrode lead lines are disposed between the capacitor columns, the lower electrode lead lines being connected to the respective lower electrodes of each of the unit capacitors.

16. The capacitor array of claim 15, wherein the shielding structure comprises:
    a first subordinate shielding structure formed on the same layer as the lower electrode and configured to substantially enclose the lower electrode; and a second subordinate shielding structure formed on the same layer as the upper electrode and configured to substantially enclose the upper electrode.

17. The capacitor array of claim 16, wherein the upper electrode comprises a first upper electrode and a second upper electrode formed on the first upper electrode, and
wherein the second subordinate shielding structure and the upper electrode connecting line are formed on the same layer as the second upper electrode.

18. The capacitor array of claim 16, further comprising,
a third subordinate shielding structure formed over the upper electrode and having a configuration of a rectangular strip.

19. The capacitor array of claim 16, further comprising,
a fourth subordinate shielding structure formed under the lower electrode and having a configuration of a rectangular strip.

20. The capacitor array of claim 16, wherein the first subordinate shielding structure has a configuration of a C-shaped strip and the second subordinate shielding structure has a configuration of two square brackets partially enclosing the second upper electrode.

21. The capacitor array of claim 16, wherein the first and the second subordinate shielding structures are electrically connected to each other through VIA contacts.

22. The capacitor array of claim 15, wherein each of the lead lines comprises a dummy pattern.

23. The capacitor array of claim 15, wherein a dummy pattern is formed between the capacitor columns.

24. The capacitor array of claim 15, wherein the lead lines are arranged between the capacitor columns in two parallel lines.

25. The capacitor array of claim 24, wherein the capacitor columns each comprises the same number of unit capacitors.

26. The capacitor array of claim 25, wherein each of the capacitor columns comprises no less than 2 and no more than 4 unit capacitors.

* * * * *